United States Patent [19]

Marek et al.

[11] Patent Number: 5,191,287
[45] Date of Patent: Mar. 2, 1993

[54] METHOD AND DEVICE FOR COMPENSATING UNDESIRABLE SIDE BANDS IN NUCLEAR MAGNETIC RESONANCE SPECTRA

[75] Inventors: Daniel Marek, Möriken; Anton Kuster, Greifensee, both of Switzerland; Arne Kasten, Karlsruhe, Fed. Rep. of Germany; Tschopp Werner, Forch, Switzerland

[73] Assignee: Spectrospin AG, Switzerland

[21] Appl. No.: 697,682

[22] Filed: May 9, 1991

[30] Foreign Application Priority Data

May 10, 1990 [GB] United Kingdom ................. 4015056
Jun. 13, 1990 [GB] United Kingdom ................. 4018836

[51] Int. Cl.$^5$ ............................................. G01R 33/20
[52] U.S. Cl. ................................... 324/307; 324/309
[58] Field of Search ............... 324/300, 307, 309, 310, 324/311, 312, 315, 314, 318, 321, 322

[56] References Cited

U.S. PATENT DOCUMENTS

| | | | |
|---|---|---|---|
| 3,968,424 | 7/1976 | Ernst | 324/310 |
| 4,065,714 | 12/1977 | Hill | 324/314 |
| 4,247,820 | 1/1981 | Keller | 324/321 |
| 4,284,949 | 8/1981 | Vidrine et al. | 324/315 |
| 4,290,019 | 9/1981 | Hutchison et al. | 324/311 |
| 4,305,036 | 12/1981 | Ernst et al. | 324/321 |
| 4,628,263 | 12/1986 | Kida | 324/321 |
| 4,734,648 | 3/1988 | Machida | 324/322 |
| 4,859,948 | 8/1989 | Kuster | 324/318 |

FOREIGN PATENT DOCUMENTS 2816225 4/1978 Fed. Rep. of Germany.
1-013444 5/1989 Japan.
2-112778 4/1990 Japan.

OTHER PUBLICATIONS

Journal of Magnetic Resonance 82, H. Levitt, pp. 427 to 433.
Journal of Magnetic Resonance 80, Gareth A. Morris, pp. 547 to 552 (1988).
Journal of Magnetic Resonance, Ogura Bd 83 Nr 1 Jun. 1989.
Journal of Magnetic Resonance Morris Bd 80, 1988.

Primary Examiner—Michael J. Tokar
Attorney, Agent, or Firm—Walter A. Hackler

[57] ABSTRACT

The present invention relates to a method and a device for compensating undesirable side bands in nuclear magnetic resonance spectrometers. The frequency ($\omega_m$) and the phase of rotation of the sample (10) are detected by means of a light sensor (12) and supplied to a compensation generator (18). The latter generates modulation signals (44 and 43) for modulating the amplitude and the phase of the detected nuclear magnetic signal of the sample, using an amplitude modulator (13) and a phase modulator (14), the modulation frequency being equal to an integral multiple, including the simple value, of the frequency of rotation ($\omega_m$) of the sample. The additional frequency components heterodyne with the side bands provoked by the rotation of the sample (10) in the static magnetic field ($B_O$), whereby the said side bands are eliminated.

15 Claims, 8 Drawing Sheets

METHOD AND DEVICE FOR COMPENSATING UNDESIRABLE SIDE BANDS IN NUCLEAR MAGNETIC RESONANCE SPECTRA

BACKGROUND OF THE INVENTION

The present invention relates to a method and a device for compensating undesirable side bands in nuclear magnetic resonance spectra.

For recording high-resolution spectra in nuclear resonance spectrometry (hereinafter called NMR spectrometry), the sample to be measured is placed in a DC magnetic field and subjected to rotational movement in order to average out a certain content of inhomogeneities of the DC magnetic field and to achieve thereby improved resolution of the spectral lines. However, this rotational movement gives rise in the spectrum to undesirable side bands, so-called rotational side bands. These appear on both sides of the respective real NMR spectral line, spaced by multiples of the frequency of the rotary movement.

The described rotational side bands are due, substantially, to three causes:

the inhomogeneities of the static magnetic field BO in the active sample volume, which are also known as BO inhomogeneities and which, together with the rotary movement of the sample, result in a modulation of the precession frequency of the nuclei. BO inhomogeneities may be caused by the field-generating magnet itself, but also by ferromagnetic, diamagnetic or paramagnetic materials in the neighborhood of the sample;

the inhomogeneities of the RF magnetic field B1, which are also known as B1 inhomogeneities and which are produced in the active sample volume during the transmitting phase by the transmitter and receiver coil, and which affect the nuclear signal induced in the receiver coil during the receiving phase; and the non-ideal rotary movement of the sample which may be provoked, on the one hand, by the axis of symmetry of the sample being displaced and/or rotated relative the rotary axis and, on the other hand, by the fact that the sample cell does not present the ideal rotational-symmetry dimensions. Both these causes have the result, in particular, that the stray capacitance between the sample and the RF receiver coil varies periodically as a function of the frequency of rotation. Given the fact that this stray capacitance has to be added to the already very small capacitance of the receiving resonant circuit, this results in periodic detuning of the resonant circuit and, thus, phase modulation of the nuclear signal. In the case of a sample causing high-frequency losses this non-ideal rotary movement in addition may lead to periodic variations of the degree of attenuation of the receiving resonant circuit and, thus, to amplitude modulation of the nuclear signal. This phase and amplitude modulation, which is provoked by the non-ideal rotary movement of a sample, is called Q modulation. The latter is particularly disturbing in the case of high frequencies above 400 MHz where the receiving resonant circuit has a very low capacitance value only so that the influences of interfering capacitances make themselves felt very seriously.

In order to facilitate understanding, the phenomenon and the underlying causes of the rotational side bands will now be explained by way of FIGS. 1 and 2.

FIG. 1a shows a typical development of the main band A, with the associated rotational side bands B, B' and C, C' of a spectral line. The rotational side bands can be broken up into their respective components, based on the three causes described above.

FIG. 1b illustrates the components caused by the B-0 inhomogeneities. The side bands are symmetrical to the main band A, and are of like phase as the latter. This experimental finding is confirmed theoretically by a paper by H. Levitt published in "Journal of Magnetic Resonance 82", pages 427 to 433.

FIG. 1c illustrates the components caused by the before-mentioned B-1 inhomogeneities. According to the experimental findings, the side bands are asymmetrical relative to the main band A, are mostly spaced from the latter by multiples of the double frequency of rotation $\omega_m$, due to the geometry of the receiving coil, and are again of like phase as the main band A.

FIG. 1d illustrates the side band components caused by the Q modulation. The side band components are antisymmetrical relative to the main band and may be of any phase relative to the main band. The antisymmetry is the result of the mainly capacitive periodic detuning of the receiving resonant circuit which principally results in a phase modulation of the nuclear signal.

FIG. 2 shows the evolution of an amplitude modulation AM and a phase modulation $\phi$M of the nuclear signal K from a periodic detuning $\Delta\omega$ of the receiving resonant circuit. The modulation frequency being small relative to the bandwidth of the resonant circuit, it is permissible to look at the situation in a quasi stationary way, as has been done in the case of FIG. 2. One obtains an amplitude modulation a(t) with twice the modulation frequency which, however, can be neglected in the case of small modulation deviations (FIG. 2a).

The phase modulation $\phi$M illustrated in FIG. 2b, which occurs at the simple modulation frequency, is more disturbing.

In order to reduce these undesirable rotational side bands, one has proposed heretofore a number of different appliances which are intended to avoid the causes giving rise to the rotational side bands at the point of their generation.

One of these known measures consists in improving the homogeneity of the static magnetic field BO, for example by the use of very space-consuming and precise shim coils. However, these shim coil systems are not in a position to satisfactorily compensate the inhomogeneities of the static magnetic field resulting from the magnetic susceptibility of the RF receiving coil. This can be achieved only by proper selection of specific materials for the RF receiving coil having negligibly small susceptibility values.

In order to improve the B1 homogeneity, it has been proposed heretofore to optimize the geometry of the RF receiving coil for optimum field homogeneity.

However, the problem of Q modulation could not be overcome by these measures. As a result of the rise in field strengths of the static magnetic field encountered in the course of time in nuclear magnetic resonance spectrometry, the undesirable side band components (Q modulation) provoked by the non-ideal rotational movement of the sample grew as well. The undesirable side bands provoked by the Q modulation could be minimized only by improving the mechanical precision of those parts which influence the rotational movement (sample cell, rotor, air turbine). However, here one then arrived at the limits of the degree of precision that could be achieved.

From "Journal of Magnetic Resonance 80, pages 547 to 552, (1988), there has been known a method for subsequent compensation of equipment errors by deconvolution, by means of an internal reference signal. According to this method, a reference signal is extracted by means of digital filters for generating an idealized spectrum using the before-mentioned deconvolution technique. The measures proposed by this paper are suited also for subsequent elimination of rotational side bands.

While it is relatively easy with the aid of the appliances proposed by the prior art for reducing rotational side bands to achieve side band intensities of about 10% of the main band intensity, it is frequently very difficult to reduce this value further to the desired value of less than 1%. This is true especially for the side band components provoked by Q modulation.

However, it may be assumed that the side-band intensities achieved by the methods of the prior art are already small relative to the main-band intensities.

From German Disclosure Document No. 28 16 225, in particular claim 1, FIG. 3 and column 2 of the specification, lines 25 to 64, there have been known a method and a device by which the side bands of a nuclear resonance spectrum, which are provoked by the rotation of the sample of the nuclear resonance spectrometer, are smeared over a given frequency range. This leads to a broad side-band component with small amplitude, instead of a sharp component with great amplitude. But the integral of the side-band component is equal in both cases. Consequently, the known method does not result in compensation of the rotational side bands; the side bands are not eliminated, but appear as broad-based hill.

SUMMARY OF THE INVENTION

Now, it is the object of the present invention to provide a method and a device for compensating undesirable side bands in nuclear magnetic resonance spectra by means of which the side bands can be reduced still further, starting out from the intensities of the rotational side bands achievable with the aid of the appliances proposed by the prior art.

The invention achieves this object in a method for compensating at least one type of NMR side bands ($H_0$, $H_1$, Q modulation side bands), which are provoked by rotation of the sample of the nuclear magnetic resonance spectrometer, by the following steps:

Detecting the frequency and phase of rotation of the sample;

modulating the amplitude and phase of the detected nuclear signal, the modulation signals being composed of a plurality of components, wherein the modulation signals are synchronized in locked phase in relation to the rotation of the sample in the case of Q modulation compensation, and the frequencies of the modulation components are equal to the frequency of the rotation of the sample and integral multiples thereof in the case of $H_0$ and $H_1$ side-band compensation, each of the phases of these components has a fixed relation to the phase of the rotation of the sample, and the start of the transmitter pulse or the pulse sequence for exciting the nuclear signal is synchronous in phase to the modulation signal.

According to an advantageous further improvement of this method, the amplitude and the phase of the individual frequency components are adjusted separately for the modulation step, the frequency components so adjusted are added and subjected to amplitude and phase modulation. According to an advantageous alternative, a plurality of cosinoidal and sinoidal signals with frequencies equal to an integral multiple of the frequency of rotation of the sample are generated in advance, the amplitudes of the signals are set at the respective amplitudes necessary for compensation, and the cosinoidal and sinoidal signals so generated and adjusted in amplitude are then added and subjected to amplitude and phase modulation.

The modulation signals may also be generated in a digital frequency generator, by resetting the respective coefficients.

Further, the above object is achieved according to the invention by a method for compensating side bands (Q modulation) generated in a pulsed nuclear magnetic resonance spectrometer by a non-ideal rotational movement of the sample, by the following steps:

Recording the frequency and phase of the rotation of the sample;

recording the number and the frequency to be compensated of the undesirable side-band components; and summing up a plurality of nuclear signals, which are phase-shifted relative to each other by predetermined phase angles and which have their origin in several excitations, the sum of 2N nuclear signals with phase shifts of $$\Delta\phi = \frac{n \cdot 360°}{2N}$$

n=0, 1, 2, 3, ..., 2N−1) being necessary for eliminating N side-band components. According to the invention, one or more of the methods solving the object of the invention can be used for producing nuclear magnetic resonance spectra which are largely free from side bands. In each case, the amplitude and phase modulation is effected by a computer by multiplication of the complex time signal corresponding to the spectrum by a complex factor $A(t)e^{j\phi(t)}$, wherein $A(t)$ is the function of time of the amplitude modulation and $\phi(t)$ is the function of time of the phase modulation.

A device for compensating at least one type of NMR side bands ($H_0$—, $H_1$—, Q modulation side bands) produced by rotation of the sample of a nuclear magnetic resonance spectrometer, that solves the object underlying the invention, comprises a transmitter and receiver coil which is arranged in the DC magnetic field so as to embrace the rotating sample, which receives a RF signal from the sample head and emits it in the direction of the sample and which thereupon receives the nuclear signal emitted by the sample and transmits it to the sample head; and a signal generation and evaluation device which generates the RF signal to be supplied to the sample head and generates the spectrum from the nuclear signal received by the sample head, and is characterized according to the invention by a detector arrangement for detecting the frequency and phase of the rotary movement of the sample, a compensation generator which receives signals representative of the frequency and phase of the rotary movement of the sample as detected by the detector arrangement and generates in response to these signals amplitude and phase-modulation signals for modulating the amplitude and phase of the nuclear signal emitted by the sample and detected by the sample head, the modulation signals being composed of a plurality of components, an amplitude modulator for amplitude-modulating the detected nuclear signal by the modulation signal generated by the compensation generator, a phase modulator for phase-modulating the detected nuclear signal by the modulation signal generated by the compensation generator, wherein the modulation signals are synchronized in locked phase relation to the rotation of the sample in the case of Q modulation compensation, and the frequencies of the modulation components are equal to the frequency of rotation of the sample and integral multiples thereof in the case of $H_0$ and $H_1$ sideband compensation, each of the phases of these components has a fixed relation to the phase of the rotation of the sample, and the start of the transmitter pulse or the pulse sequence for exciting the nuclear signal is synchronous in phase to the modulation signal.

According to one advantageous embodiment of the invention, the compensation generator comprises:

For each pair of side bands to be compensated two phase shifters that can be set continuously and separately and two attenuator elements that can be set separately, for separate adjustment of the phase and amplitude of the signals to be supplied to the phase and amplitude modulator. According to a preferred embodiment of the invention, the compensation generator comprises:

For each pair of side bands to be compensated one oscillator module for generating cosinoidal and sinoidal signals with frequencies equal to an integral multiple, including the simple, frequency of rotation of the sample, each oscillator module comprising continuously adjustable attenuator elements for setting the required amplitude of each sinoidal and cosinoidal signal, a fixed 90° phase shifter deriving the cosinoidal signals from the sinoidal signals and comprising a polarity-reversing switch for each attenuator element, and adding elements for adding up the sinoidal and cosinoidal signals emitted by the polarity-reversing switches, the output signals of the adding elements being supplied in each case to the amplitude and phase modulator.

The compensation generator may also be a digital frequency generator which produces the modulation signals for the amplitude and phase modulation by presetting the corresponding coefficients.

The method and device proposed by the invention enable in an advantageous manner the amplitude and phase of the rotational side bands to be set individually to desired values so that it is possible without any difficulties to achieve intensities of the rotary side-band components of less than 1% of the main-band intensity.

The invention will now be described in more detail by way of certain embodiments of the invention, by reference to the drawing.

DESCRIPTION OF THE PREFERRED EMBODIMENTS

Figure 3:
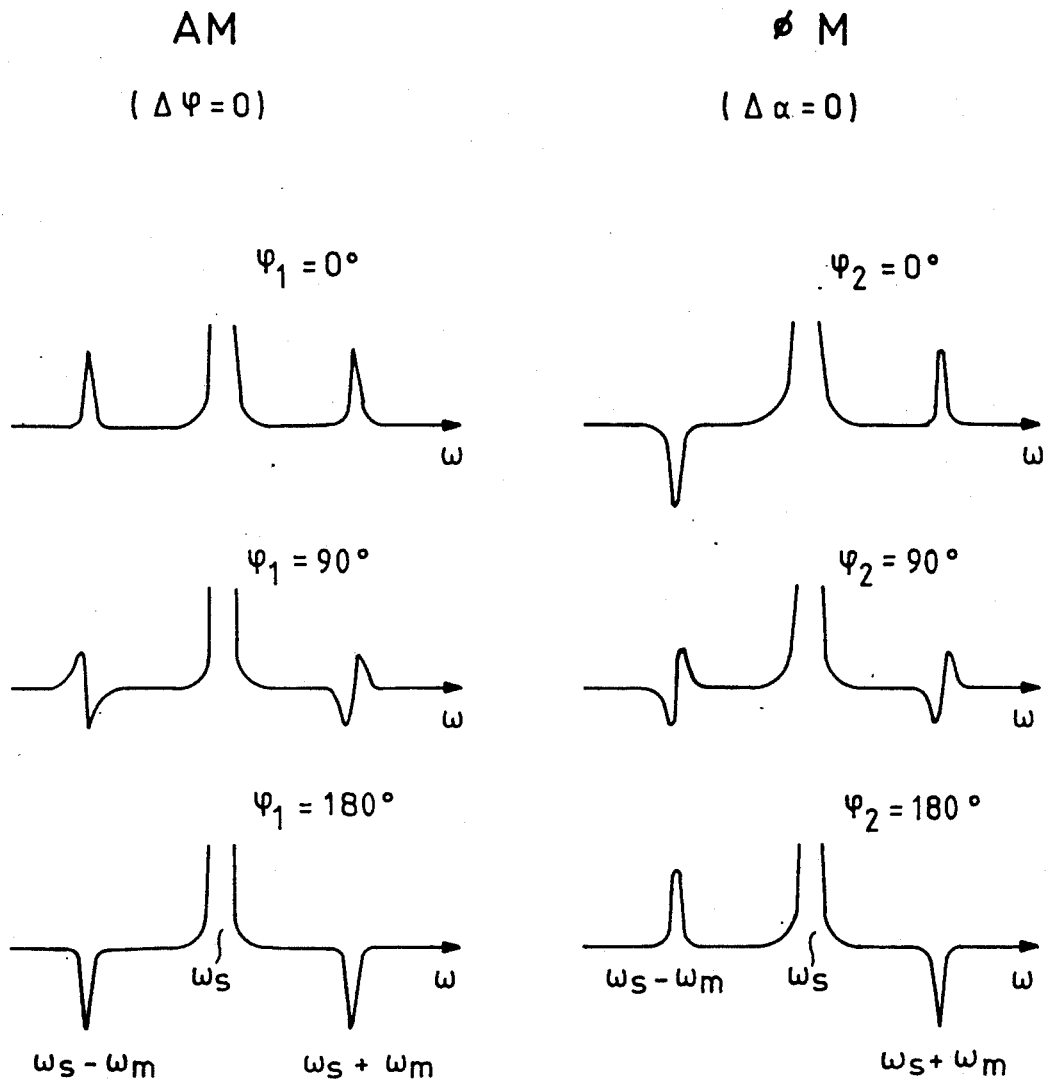
FIG. 3 shows diagrams illustrating the influence on the frequency spectrum of an amplitude and phase modulation.

Before going into the details of the method and the device according to the invention, for compensating undesirable side bands in nuclear magnetic resonance spectra, we will now first describe, by way of FIG. 3, the principle of modulating a nuclear signal received, and the influence which the amplitude and phase modulation of the nuclear signal has on the spectrum.

The nuclear signal, without any rotational side bands, as supplied by the receiving resonant circuit can be expressed as $$y_1(t) = A \cdot e^{-\frac{t}{T_2}} \cos(\omega_o t + \phi_o) \tag{1}$$

This signal is to be subjected to both, an amplitude modulation AM and a phase modulation $\phi M$.

With respect to the amplitude modulation, the following holds:

$$a(t) = 1 + \Delta a(t) = 1 + \Delta a \cos(\omega t + \phi_1) \tag{2}$$

With respect to the phase modulation $\phi M$ the following holds:

$$\Delta\phi(t) = \Delta\phi \sin(\omega_m t + \phi_2) \tag{3}$$

The modulated nuclear signal comes to:

$$y_2 = A e^{-\frac{t}{T_2}} [1 + \Delta a(t)] \cos[\omega_o t + \phi_o + \Delta\phi(t)]$$

If small modulation deviations are used, i.e. if $|\Delta\phi(t)|^2 < < 1$, then $$y_2(t) = A e^{-\frac{t}{T_2}} [1 + \Delta a(t)] \{\cos(\omega_o t + \phi_o) - \Delta\phi(t)\sin(\omega_o t + \phi_o)\}$$

If in addition $|\Delta a(t) \cdot \Delta a(t)| < < 1$, then:

$$y_2(t) = A e^{-\frac{t}{T_2}} \{\cos(\omega_o t + \phi_o) + \Delta a(t)\cos(\omega_o t + \phi_o) -$$

$$\Delta\phi(t)\sin(\omega_o t + \phi_o)\}$$

$$y_2(t) = A e^{-\frac{t}{T_2}} \{\cos(\omega_o t + \phi_o) + \Delta a \cos(\omega_o t + \phi_o)\cos(\omega_m t +$$

-continued $$\phi_1) - \Delta\phi \sin(\omega_o t + \phi_o)\sin(\omega_m t + \phi_2)\}$$

$$y_2(t) = Ae^{-\frac{t}{T_2}}\cos(\omega_o t + \phi_o) + Ae^{-\frac{t}{T_2}}\frac{\Delta a}{2}\{\cos[(\omega_o + \omega_m)t + \phi_o + \phi_1] + \cos[(\omega_o - \omega_m)t + \phi_o - \phi_1]\} +$$

$$Ae^{-\frac{t}{T_2}}\frac{\Delta\phi}{2}\{\cos[(\omega_o + \omega_m)t + \phi_o + \phi_2] - \cos[(\omega_o - \omega_m)t + \phi_o - \phi_2]\}$$

This signal is then converted down to an intermediate frequency where is subjected to a quadrature detection process. As a result, two low-frequency signals $y_A(t)$ and $y_B(t)$ are obtained which are positioned orthogonally relative to each other and which have frequencies of around $\omega_s$ $$y_A(t) = Ae^{-\frac{t}{T_2}}\cos(\omega_s t + \phi_o) + Ae^{-\frac{t}{T_2}}\frac{\Delta a}{2}\{\cos[(\omega_s + \omega_m)t + \phi_o + \phi_1] + \cos[(\omega_s - \omega_m)t + \phi_o - \phi_1]\} +$$

$$Ae^{-\frac{t}{T_2}}\frac{\Delta\phi}{2}\{\cos[(\omega_s + \omega_m)t + \phi_o + \phi_2] - \cos[(\omega_s - \omega_m)t + \phi_o - \phi_2]\}$$

$$y_B(t) = Ae^{-\frac{t}{T_2}}\sin(\omega_s t + \phi_o) + Ae^{-\frac{t}{T_2}}\frac{\Delta a}{2}\{\sin[(\omega_s + \omega_m)t + \phi_o + \phi_1] + \sin[(\omega_s - \omega_m)t + \phi_o - \phi_1]\} +$$

$$Ae^{-\frac{t}{T_2}}\frac{\Delta\phi}{2}\{\sin[(\omega_s + \omega_m)t + \phi_o + \phi_2] - \sin[(\omega_s - \omega_m)t + \phi_o - \phi_2]\}$$

If one regards $y_A(t)$ as the real content and $y_B(t)$ as the imaginary content of a complex time signal $\bar{y}_3(t)$, and if one further observes the relatinoship $$\cos\alpha + j\sin\alpha = e^{j\alpha}$$

then one obtains:

$$\bar{y}_3 = Ae^{-\frac{t}{T_2}}e^{j(\omega_s t + \phi_o)} + Ae^{-\frac{t}{T_2}}\frac{\Delta a}{2}\{e^{j((\omega_s+\omega_m)t+\phi_o+\phi_1)} + e^{j((\omega_s-\omega_m)t+\phi_o-\phi_1)}\} + Ae^{-\frac{t}{T_2}}\frac{\Delta\phi}{2}\{e^{j((\omega_s+\omega_m)t+\phi_o+\phi_2)} - e^{j((\omega_s-\omega_m)t+\phi_o-\phi_2)}\} \quad (4)$$

This complex function is then subjected to Fourier transformation in the computer, which results in the complex signal $\bar{F}_3(\omega)$ in the frequency range:

$$F_3(\omega) = AT_2 e^{j\phi_o}[\Delta_o(\omega) - jd_o(\omega)] \quad \}\text{Main band} \quad (5)$$

$$+ AT_2\frac{\Delta a}{2} e^{j(\phi_o+\phi_1)} [\Delta_{+1}(\omega) - jd_{+1}(\omega)] \left.\vphantom{\frac{\Delta a}{2}}\right\}\text{Amplitude-modulation side bands}$$
$$+ AT_2\frac{\Delta a}{2} e^{j(\phi_o-\phi_1)} [a_{-1}(\omega) - jd_{-1}(\omega)]$$

$$+ AT_2\frac{\Delta\phi}{2} e^{j(\phi_o+\phi_2)} [\Delta_{+1}(\omega) - jd_{+1}(\omega)] \left.\vphantom{\frac{\Delta\phi}{2}}\right\}\text{Phase-modulation side bands}$$
$$+ AT_2\frac{\Delta\phi}{2} e^{j(\phi_o-\phi_2)} [a_{-1}(\omega) - jd_{-1}(\omega)]$$

wherein $a(\omega)$ is the absorption signal and $d(\omega)$ is the dispersion signal:

$$a(\omega) = \frac{1}{1 + [(\omega - \omega_R)T_2]^2} \quad (6)$$

$$d(\omega) = \frac{(\omega - \omega_R)T_2}{1 + [(\omega - \omega_R)T_2]^2} \quad (7)$$

The indices 0, +1 and +1 of $a(\omega)$ and $d(\omega)$ in equation (5) stand for $$\omega_R = \omega_s, \omega_R = \omega_s + \omega_m \text{ and } \omega_R = \omega_s - \omega_m,$$

respectively.

The RF phase $\phi_o$ is compensated in the computer by complex multiplication of $\bar{F}_3(\omega)$ by $e^{-j\phi_o}$. The result is the phase-corrected signal $\bar{F}_4(\omega)$:

$$F_4(\omega) = AT_2[a_o(\omega) - jd_o(\omega)] \quad \}\text{Main band}$$

$$+ AT_2\frac{\Delta a}{2} e^{j\phi_1}[a_{+1}(\omega) - jd_{+1}(\omega)] \left.\vphantom{\frac{\Delta a}{2}}\right\}\text{Amplitude-modulation side bands}$$
$$+ AT_2\frac{\Delta a}{2} e^{-j\phi_1}[a_{-1}(\omega) - jd_{-1}(\omega)]$$

$$+ AT_2\frac{\Delta\phi}{2} e^{j\phi_2}[a_{+1}(\omega) - jd_{+1}(\omega)] \left.\vphantom{\frac{\Delta\phi}{2}}\right\}\text{Phase-modulation side bands}$$
$$+ AT_2\frac{\Delta\phi}{2} e^{-j\phi_2}[a_{-1}(\omega) - jd_{-1}(\omega)]$$

The real content of $F_4(\omega)$ is defined by:

$$RF_4(\omega) = AT_2 a_o(\omega) \quad \}\text{Main band} \quad (8)$$

$$+ AT_2\frac{\Delta a}{2} [\cos\phi_1 a_{+1}(\omega) + \sin\phi_1 d_{+1}(\omega)] \left.\vphantom{\frac{\Delta a}{2}}\right\}\text{Amplitude-modulation side bands}$$
$$+ AT_2\frac{\Delta a}{2} [\cos\phi_1 a_{-1}(\omega) + \sin\phi_1 d_{-1}(\omega)]$$

$$+ AT_2\frac{\Delta\phi}{2} [\cos\phi_2 a_{+1}(\omega) + \sin\phi_2 d_{+1}(\omega)] \left.\vphantom{\frac{\Delta\phi}{2}}\right\}\text{Phase-modulation side bands}$$
$$+ AT_2\frac{\Delta\phi}{2} [\cos\phi_2 a_{-1}(\omega) + \sin\phi_2 d_{-1}(\omega)]$$

This real content has been recorded in FIG. 3 for the cases where $\phi_1, \phi_2 = 0°, 90°, 180°$.

In the case of simultaneous amplitude and phase modulation, the two side bands are as follows:

Upper side band (OSB):

$$OSB = AT_2\left(\frac{\Delta a}{2}\cos\phi_1 + \frac{\Delta\phi}{2}\cos\phi_2\right)a_{+1}(\omega) + \quad (9)$$

$$AT_2\left(\frac{\Delta a}{2}\sin\phi_1 + \frac{\Delta\phi}{2}\sin\phi_2\right)d_{+1}(\omega) = C_{o1}a_{+1}(\omega) +$$

$$C_{o2}d_{+1}(\omega)$$

-continued and

Lower side band (USB):

$$USB = AT_2\left(\frac{\Delta a}{2}\cos\phi_1 - \frac{\Delta\phi}{2}\cos\phi_2\right)a_{-1}(\omega) -$$

$$AT_2\left(\frac{\Delta a}{2}\sin\phi_1 - \frac{\Delta\phi}{2}\sin\phi_2\right)d_{-1}(\omega) = C_{u1}a_{-1}(\omega) + C_{u2}d_{-1}(\omega)$$
(10)

the coefficients being $$C_{o1} = AT_2\left(\frac{\Delta a}{2}\cos\phi_1 + \frac{\Delta\phi}{2}\cos\phi_2\right)$$

$$C_{o2} = AT_2\left(\frac{\Delta a}{2}\sin\phi_1 + \frac{\Delta\phi}{2}\sin\phi_2\right)$$

$$C_{u1} = AT_2\left(\frac{\Delta a}{2}\cos\phi_1 - \frac{\Delta\phi}{2}\cos\phi_2\right)$$

$$C_{u2} = AT_2\left(\frac{\Delta a}{2}\sin\phi_1 - \frac{\Delta\phi}{2}\sin\phi_2\right)$$
(11)

These definitions, and the diagrams illustrated in FIG. 3, show that, on the condition of a small modulation degree for both the amplitude and the phase modulation, modulation with a constant modulation frequency leads in each case to two side bands only which are firstly small relative to the main band and secondary symmetrical—in the case of amplitude modulation—and antisymmetrical—in the case of phase modulation—relative to the main band. However, exact compensations of the rotational side bands can be achieved with these modulation side bands only on the condition that the rotational side bands are also small relative to the main band (for example smaller than 10%). However, this condition cannot be fulfilled with the aid of the means now available in the art.

It should be noted at this point that a sinoidal phase-modulated signal would theoretically supply an infinitely broad frequency spectrum. In the case of small phase deviations of $\Delta\phi$, i.e. if $(\Delta\phi)^2$ is much smaller than 1, the spectrum is reduced, however, to only two side bands together with a dominant main band, while theoretically all the other side bands are still present, their intensity is so small that they can be neglected.

It can be demonstrated very easily that it is possible with the aid of the amplitude and phase modulation of the nuclear signal as proposed according to the invention to adjust the amplitude and the phase of the two side bands individually to any value. For, if one regards the above system of equations (11), the latter's equations represent a linear system with the four unknown quantities $\Delta a$, $\Delta\phi$, $\phi_1\phi_2$ and the four known quantities $C_{o1}$, $C_{o2}$, $C_{u1}$, $C_{u2}$, the latter four quantities being the desirable amplitudes of the absorptive and the dispersive contents of the upper and the lower side band. This system of equations can be resolved.

The previous mathematical derivations and conclusions apply to the case of small phase variations of the phase modulation. These results lead to simple compensation processes as each individual pair of side bands can be compensated separately, without influencing the other side bands. However, this compensation process is suitable only where the rotational side bands to be compensated are also small relative to the main band. However, it is important to note here that even in the case of important rotational side bands compensation is still possible with the aid of the method according to the invention, though it is then much more troublesome it being then no longer possible to compensate the individual pairs of side bands independently one from the other.

Figure 1:
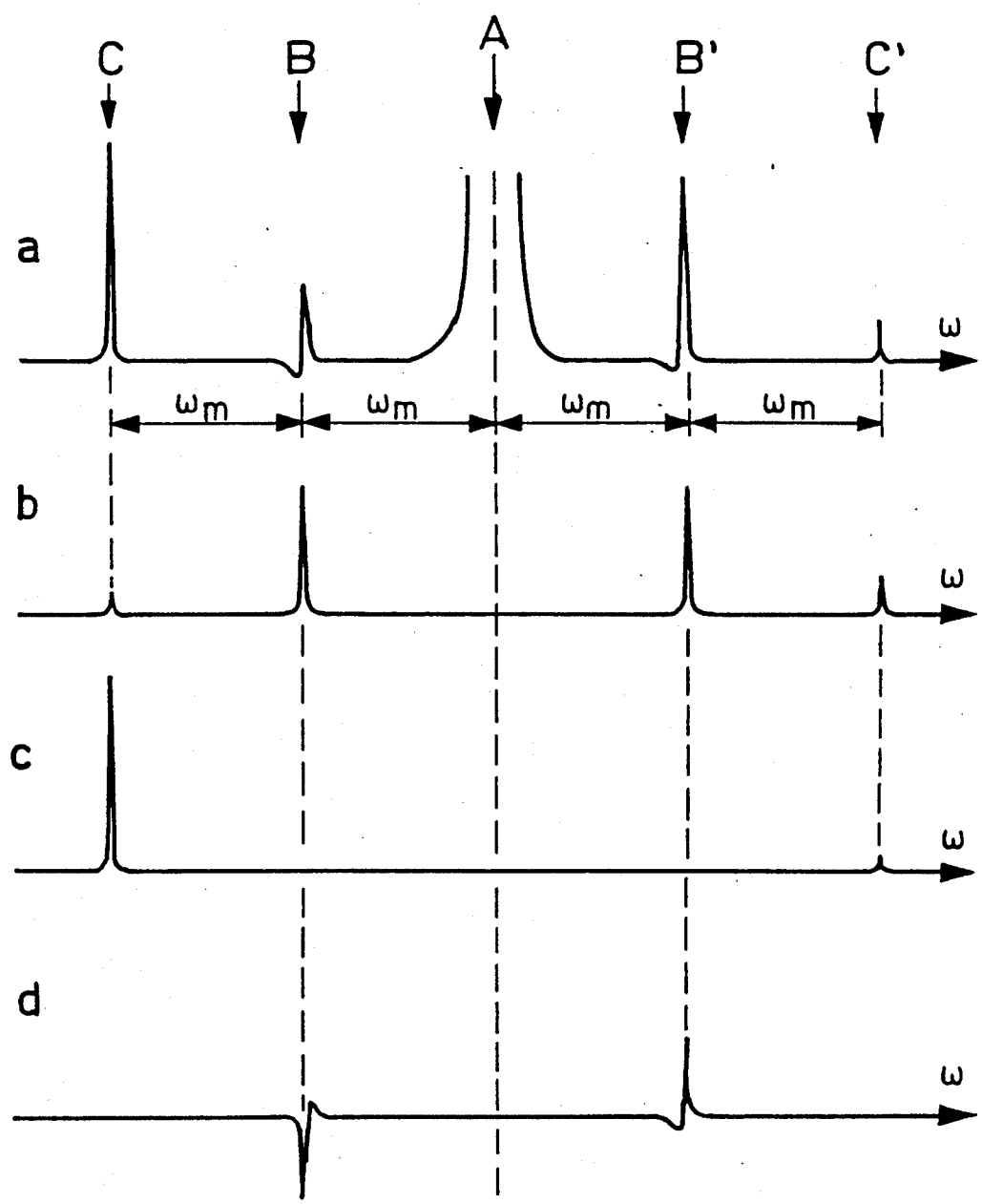
FIG. 1a shows a development of the main band A, with the associated rotational side bands B, B' and C, C' of a spectral line.
FIG. 1b illustrates the components caused by the B-0 inhomogeneities.
FIG. 1c illustrates the components caused by the B-1 inhomogeneities.
FIG. 1d illustrates the side band components caused by the Q modulation.
Figure 2:
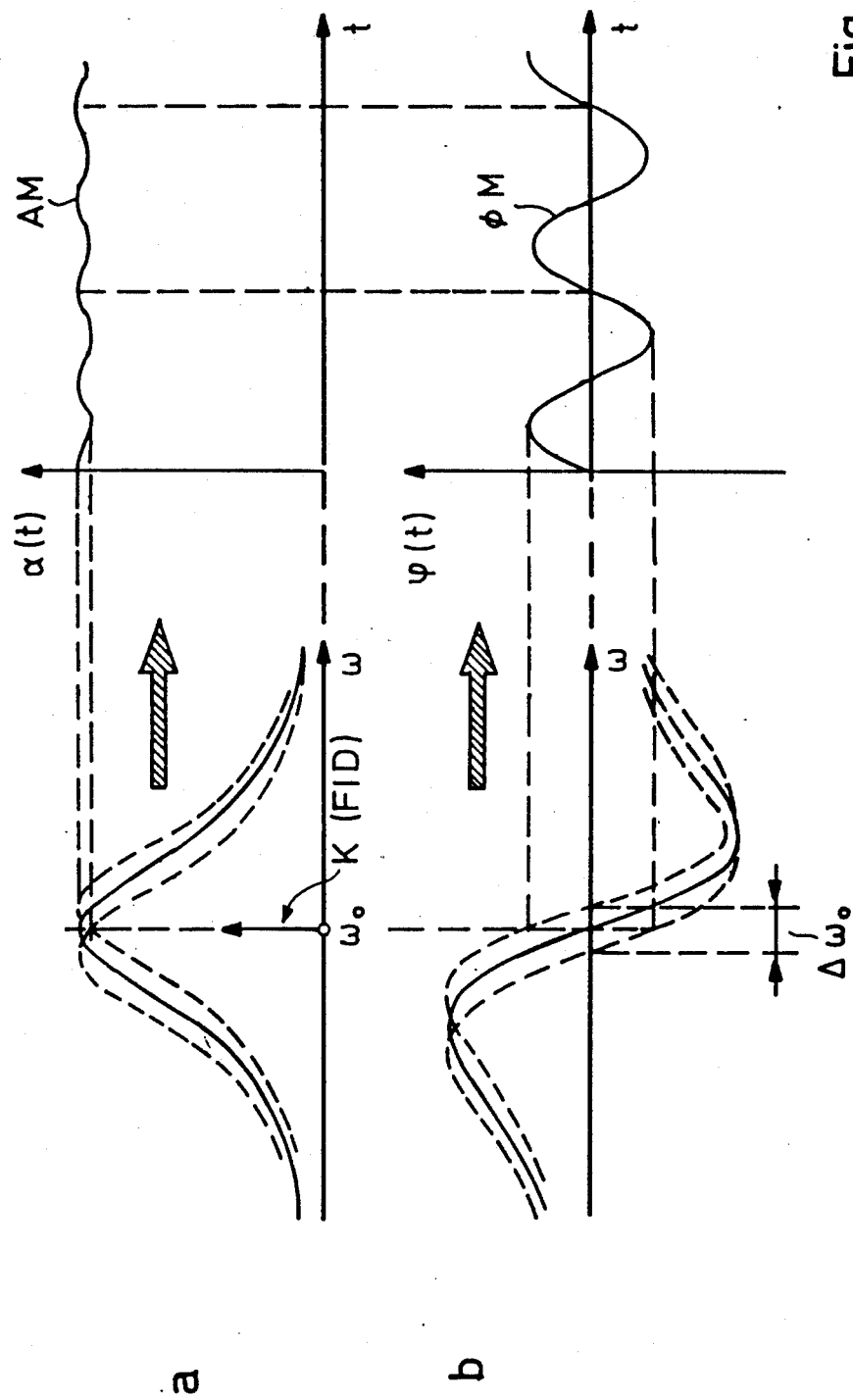
FIG. 2 shows the evolution of an amplitude modulation AM and a phase modulation $\phi M$ of the nuclear signal K from a periodic detuning $\Delta\omega$ of the receiving resonant circuit.

As has been explained already by reference to FIG. 1, the rotational side bands caused by B0 and B1 inhomogeneities are of the same or of opposite phase as the main band, i.e. their phase relationship to the main band is fixed and independent of the phase of the rotary movement. This characteristic must be transferred also to the modulation side bands, which is achieved by starting the transmitter pulse, which excites the nuclear signal, in phase synchronism to the modulation signal.

The rotational side bands, which are caused by the Q modulation, may have any different phase, relative to the main band, so that they do not necessarily require the before-described phase synchronism. On the other hand, the phase of these side bands is correlated directly to the rotation of the sample so that it is absolutely necessary here that the modulation signal for compensating the side bands must be synchronous in phase to the rotation of the sample. If it is additionally desired for the NMR spectrum, together with its side bands, to remain equal after every pulse excitation—this would largely facilitate the compensation process—then it would, however, be necessary in addition to ensure synchronism in phase between the start of the excitation pulse and the frequency of rotation.

Figure 4:
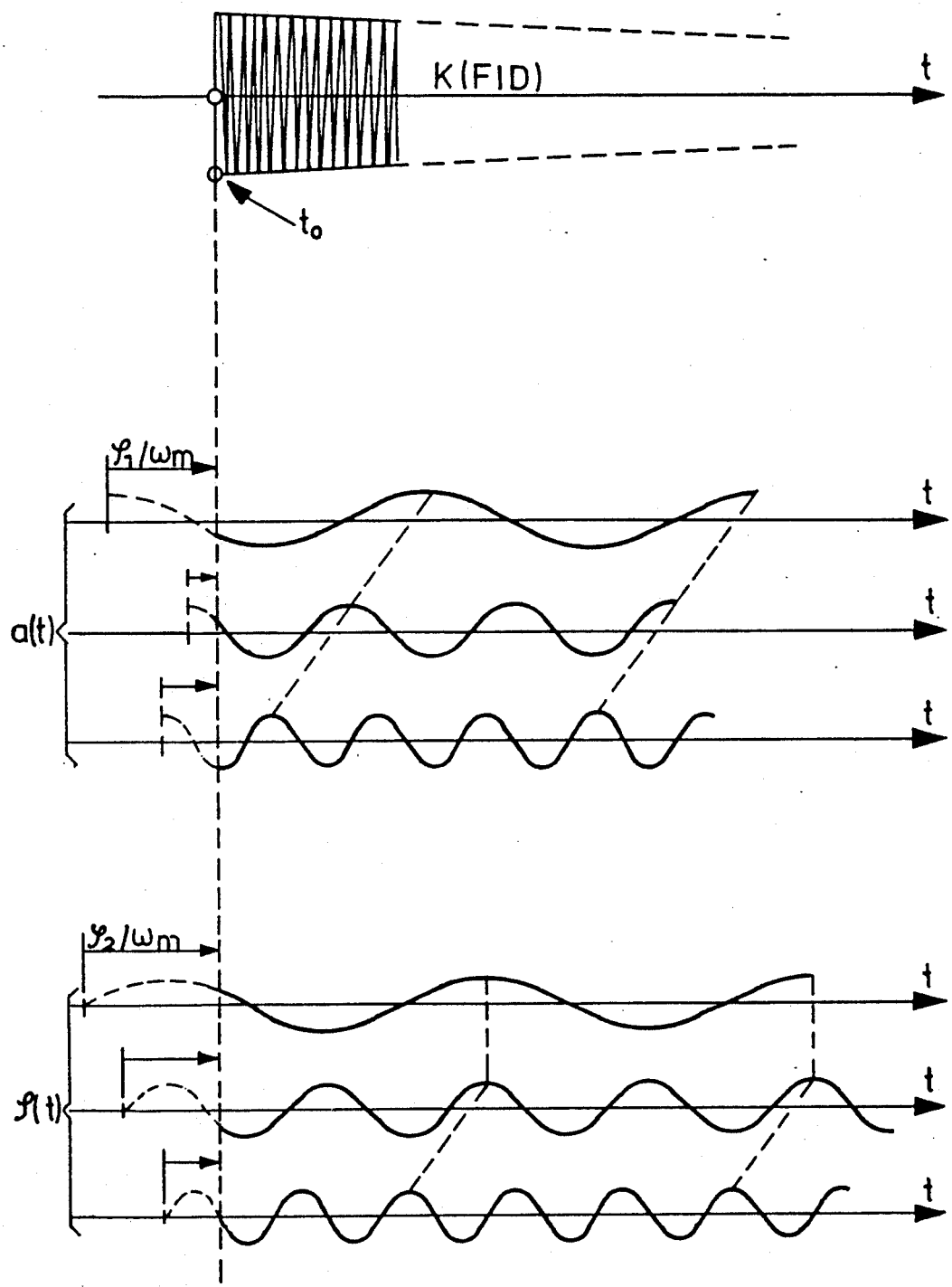
FIG. 4 shows diagrams illustrating a first way of generating the signals for the amplitude and phase modulation.

An advantageous method for generating the amplitude and phase-modulation signals will now be described by reference to FIG. 4.

The amplitude and phase of the different frequency components are set separately. The different frequency components are added up, and the sum is supplied to an amplitude modulator and a phase modulator, respectively. The nuclear magnetic signal is modulated in amplitude and phase by the amplitude-modulation signals a(t) and the phase-modulation signals $\phi(t)$ supplied to these modulators. FIG. 4 illustrates clearly the necessity to synchronize the phase position of the different frequency components and the starting point $t_0$ of the signal-detecting step.

For practical implementation of this theory, two continuously settable phase shifters and two settable attenuators are required per pair of side bands. In order to compensate side bands up to the third order it is, therefore, necessary to provide six continuously settable phase shifters and six settable attenuators which serve to set the amplitude.

Figure 5:
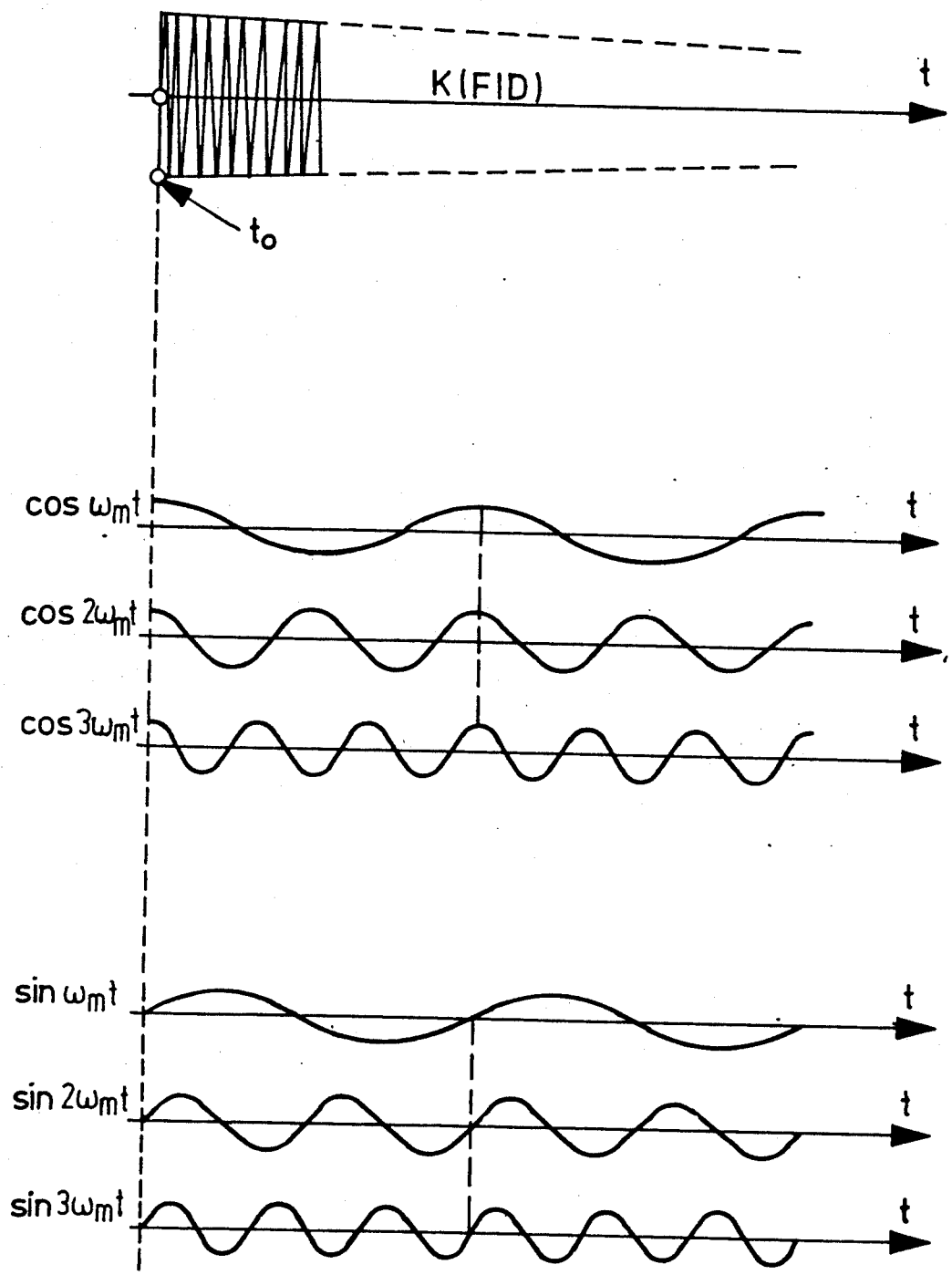
FIG. 5 shows diagrams illustrating a second way of generating the signals for the amplitude and phase modulation.

FIG. 5 illustrates a preferred method that can be used alternatively, instead of the before-described method, for generating the amplitude-modulation and the phase-modulation signals. This method works without any continuously settable phase shifters. It consists of generating at first cosinoidal and sinoidal signals of the frequencies $\omega_m$, $2\omega_m$, $3\omega_m$, ... which are then adjusted to the required amplitude using settable attenuators, are thereafter added up and supplied to the phase modulator and the amplitude modulator. With the main band in absorption, cosinoidal signals generate symmetrical absorption side bands in the amplitude modulator and antisymmetrical dispersion side bands in the phase modulator. Conversely, sinoidal signals generate symmetrical dispersion side bands in the amplitude modulator and antisymmetrical absorption side bands in the phase modulator. These circumstances appear from the above derivation of the modulation of the nuclear magnetic signal, and the representation of FIG. 3. It is possible to produce both symmetrical and antisymmetrical absorption and dispersion side bands. This provides the possibility to attain any phases and amplitudes for the upper and lower side bands.

Figure 8:
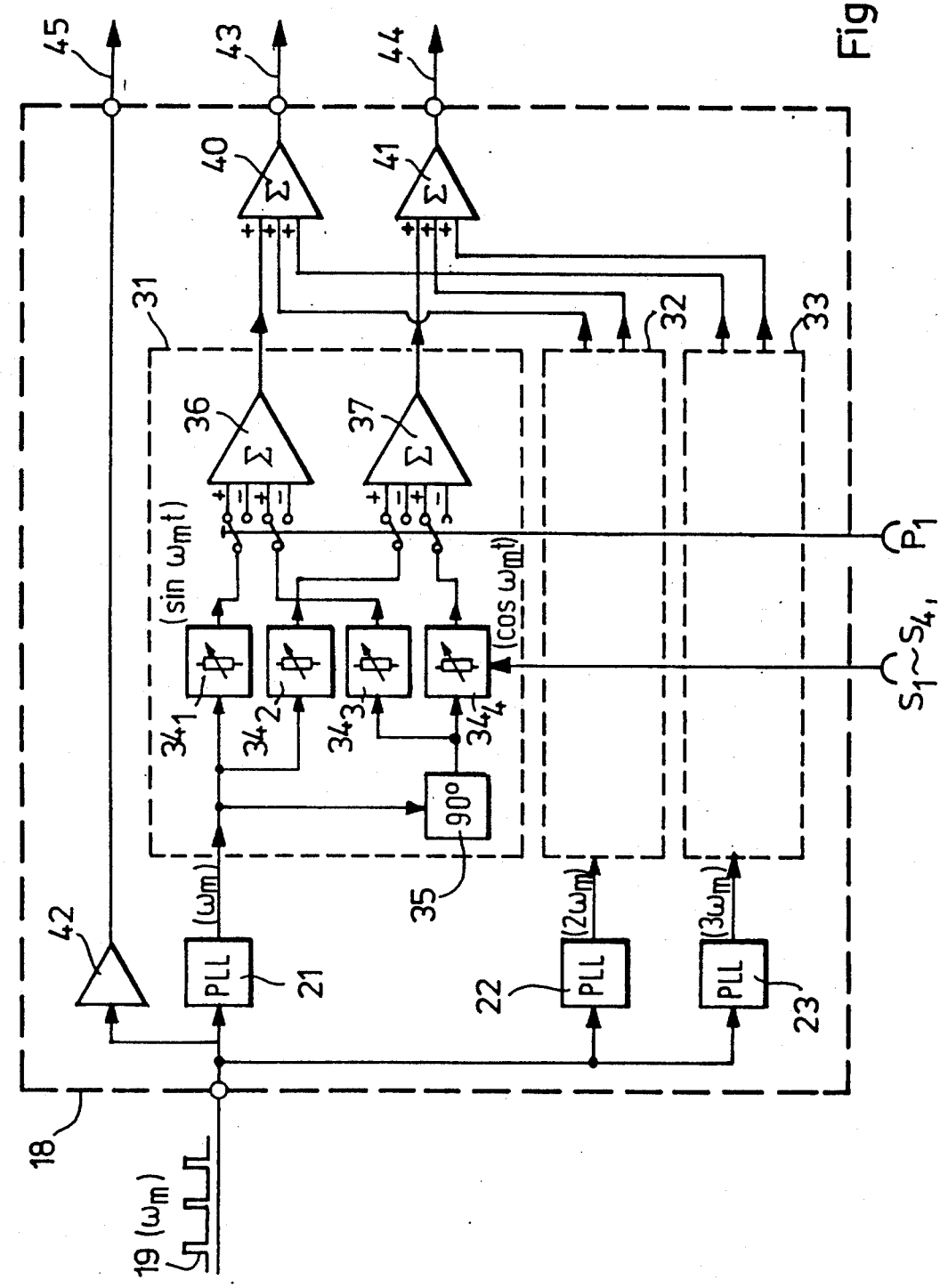
FIG. 8 shows a block diagram of one embodiment of a compensation generator illustrated in FIG. 7.

FIG. 8 shows one embodiment of a compensation generator for generating the modulation signals according to the method described last. This embodiment is intended for compensating side bands up to the third order. The illustrated compensating generator 18 comprises three fixed-phase oscillators 21, 22 and 23 for generating the base frequencies $\omega_m$, $2\omega_m$ and $3\omega_m$. These base frequencies are derived from the rotation frequency $\omega_m$ supplied, and are in synchronism with that frequency. Each of the base frequencies $\omega_m$, $2\omega_m$ and $3\omega_m$ is supplied to a signal generator module 31, 32 and 33, respectively. The structure of these three signal generator modules is generally identical so that only one signal generator module 31 is illustrated in detail. Each signal generator module comprises a 90° phase shifter 35 and four adjustable attenuators $34_1$, $34_2$, $34_3$ and $34_4$ which generate the signals $\sin \omega_m t$ and $\cos \omega_m t$ with the required amplitude, in response to incoming setting signals S1 to S4. The signals $\sin \omega_m t$ and $\cos \omega_m t$, which are thus fixed as regards their amplitude and phase position, are supplied to polarity-reversing switches 36 and 37 which generate sinoidal and cosinoidal signals for both, symmetrical and antisymmetrical absorption and dispersion side bands, depending on the pre-set switching state as determined by a setting signal P1. Finally, the sinoidal and cosinoidal signals of the different frequencies $\omega_m$, $2\omega_m$, $3\omega_m$ are added up by summators 40 and 41. The output signals 43 and 44 of the summators 40 and 41, respectively, are supplied to the phase modulator and the amplitude modulator. For synchronizing the starting point of the signal-detecting phase in the computer, the signal $\omega_m$, which is supplied to the compensation generator, is fed to the computer as the signal 45, via an amplifier element 42.

The above description of the arrangement illustrated in FIG. 8 shows clearly that one can do without a continuously settable phase shifter. It is possible with the aid of the arrangement illustrated in FIG. 8 to generate both symmetrical and antisymmetrical absorption and dispersion side bands. This enables any phase and amplitude to be attained for the upper and the lower side bands. For compensating side bands up to the third order, three fixed 90° phase shifters are required for generating the three sinoidal and the three corresponding cosinoidal functions. In addition, there are required four settable attenuators per modulation frequency, i.e. a total of twelve attenuators, and finally one polarity-reversing switch per attenuator. The advantage of this second method, which is implemented by means of the circuit illustrated in FIG. 8, resides in the fact that no continuously operating phase shifters are required.

It goes without saying that the modulation signal may be generated also digitally by a frequency generator, by presetting the corresponding coefficients of the modulation signals according to the above system of equations 11.

Figure 6:
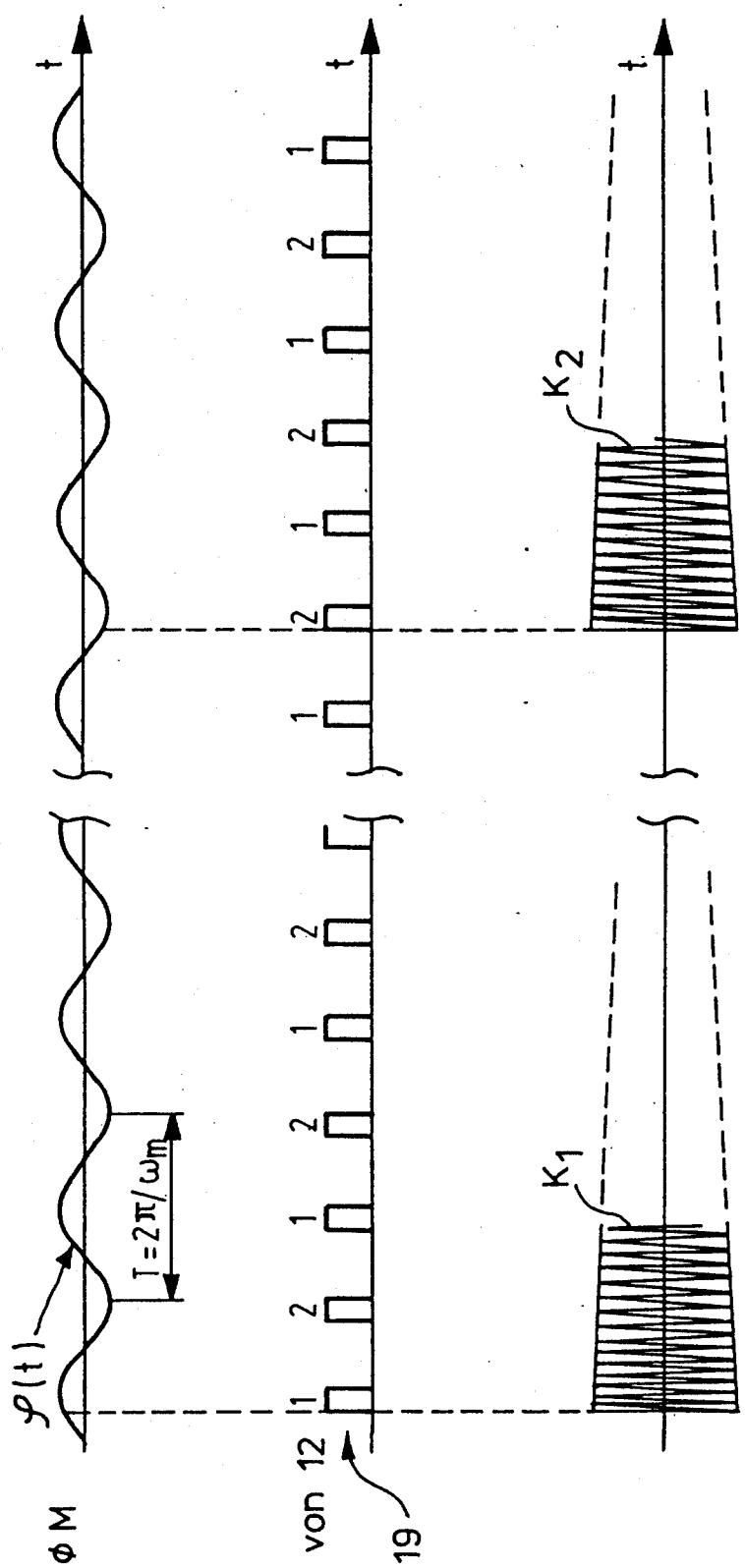
FIG. 6 shows diagrams illustrating the compensation of the base frequency of the Q modulation.

The timing diagram of FIG. 6 illustrates another method of compensating the side bands caused by the Q modulation. The middle line represents the pulses 19 emitted by a light sensor 12, illustrated in FIG. 7, according to the rotation of the sample. It is a precondition for the method illustrated in FIG. 6 that nuclear magnetic signals are generated by summing up a plurality of pulse excitations. From FIG. 6 it appears very clearly that the starting times of the two illustrated nuclear magnetic signals K1 and K2 are different in phase relative to the modulation signal $\phi(t)$. The start of the second nuclear magnetic signal, if compared to the phase-modulation voltage, is shifted in phase by exactly 180°. After summing up the two nuclear magnetic signals one obtains a phase modulation equal to zero, the phase modulation being balanced out exactly by summing up the modulation voltages of the first and of the second nuclear magnetic signal.

However, the method explained by reference to FIG. 6 only permits to compensate the side bands with the frequency components $\omega_m$ resulting from the Q modulation. If in addition to the frequency components $\omega_m$, the Q modulation comprises also higher components $2\omega_m$, $3\omega_m$, etc., there must be summed up more than two nuclear magnetic signals whose starting times must also be shifted in phase differently, relative to the modulation voltage.

If, for example, the components $\omega_m$ and $2\omega_m$ are to be eliminated at the same time, there must be summed up four nuclear magnetic signals which must be excited, shifted in phase by n·90° (n=0, 1, 2, 3), relative to the base-frequency components of the modulation voltage.

More exactly, the four nuclear magnetic signals must be excited, each shifted in phase by 90°, relative to the base-frequency components of the Q modulation:

$$\Delta t_n = n\Delta t = n\frac{\pi}{2\omega_m} \quad (n = 0, 1, 2, 3)$$

The modulation voltages $m_A(t)$, $m_B(t)$, $m_C(t)$ and $m_D(t)$ of the four nuclear magnetic signals are, therefore, defined by the formulas:

$$m_A(t) = a_1\sin(\omega_m t + \beta_1) + a_2\sin(2\omega_m t + \beta_2)$$

$$m_B(t) = a_1\sin[\omega_m(t-\Delta t) + \beta_1] + a_2\sin[2\omega_m(t-\Delta t) + \beta_2]$$

$$m_C(t) = a_1\sin[\omega_m(t-2\Delta t) + \beta_1] + a_2\sin[2\omega_m(t-2\Delta t) + \beta_2]$$

$$m_D(t) = a_1\sin[\omega_m(t-3\Delta t) + \beta_1] + a_2\sin[2\omega_m(t-3\Delta t) + \beta_2]$$

If one substitutes $$\Delta t = \frac{\pi}{2\omega_m}$$

in the above formulas, one obtains:

$$m_A(t) = a_1\sin(\omega_m t + \beta_1) + a_2\sin(2\omega_m t + \beta_2)$$

$$m_B(t) = a_1\cos(\omega_m t + \beta_1) - a_2\sin(2\omega_m t + \beta_2)$$

$$m_C(t) = -a_1\sin(\omega_m t + \beta_1) + a_2\sin(2\omega_m t + \beta_2)$$

$$m_D(t) = -a_1\cos(\omega_m t + \beta_1) - a_2\sin(2\omega_m t + \beta_2)$$

The nuclear magnetic signal resulting from the summation of the four original nuclear magnetic signals is modulated by a signal resulting from the sum of the four individual modulations:

$$m_A(t)+m_B(t)+m_C(t)+m_D(t)=0$$

This sum is equal to zero, which shows that this method actually permits to compensate the modulation components $\omega m$ and $2\omega m$.

In order to eliminate three components, namely $\omega_m$, $2\omega_m$ and $3\omega_m$, the sum of six nuclear magnetic signals is required, which must be excited phase-shifted by $n \cdot 60°/2N$ (n=1, 2, 3, 4, 5).

In general terms, the elimination of N components requires the sum of 2N nuclear magnetic signals with respective phase shifts of $n \cdot 360°/2N$ (n=1, 2, ..., 2N−1).

In the case of the last-described method for compensating the side bands provoked by the Q modulation, one requires high stability of the frequency of rotation, which must be the higher the greater the number of summed-up nuclear magnetic signals is. This method does not work for compensating the rotational side bands caused by the B0 or B1 inhomogeneities. For, these side bands exhibit a fixed phase relationship to the main band which is independent of the phase of rotation.

Figure 7:
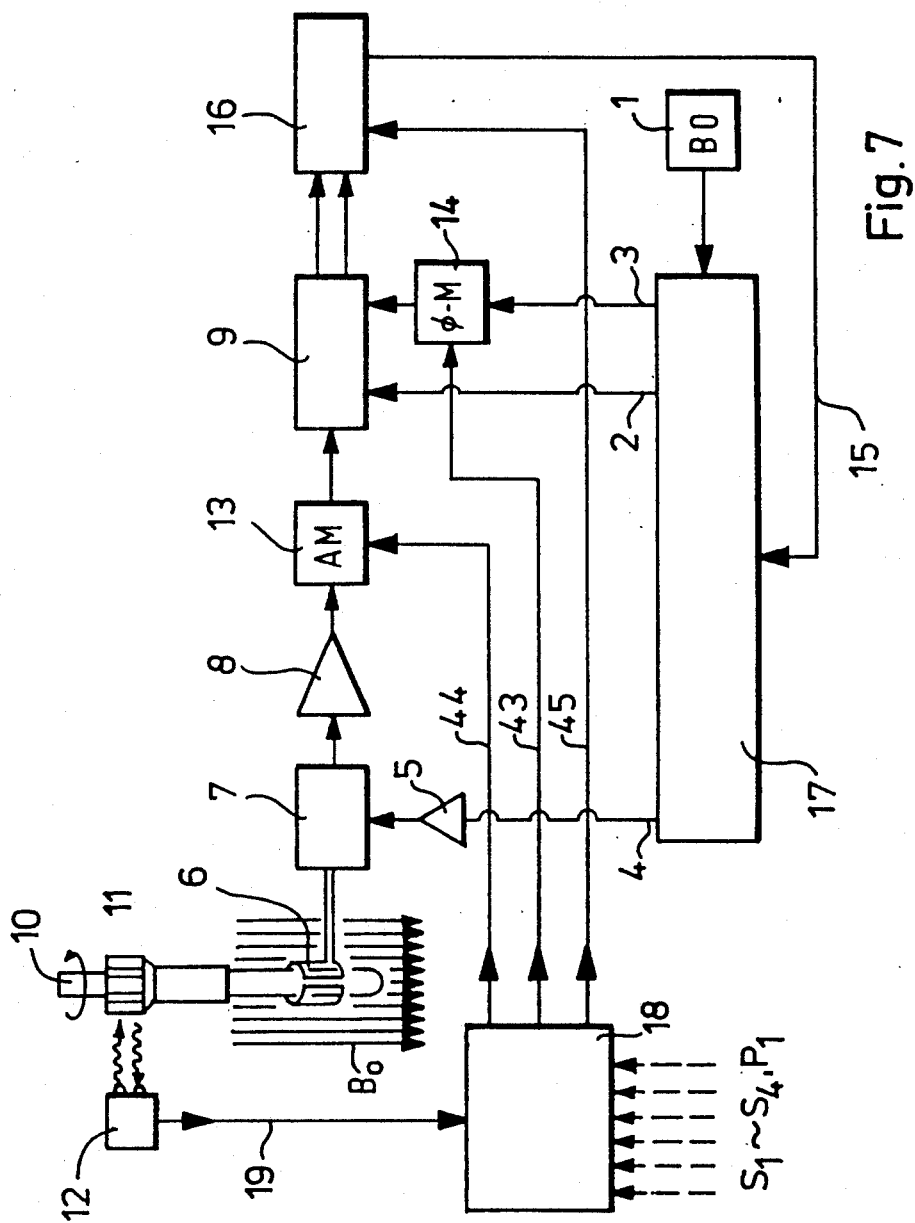
FIG. 7 shows one embodiment of a circuit arrangement for compensating the rotational side bands.

FIG. 7 shows, by way of a block diagram, one preferred embodiment of a device according to the invention for compensating undesirable side bands of nuclear magnetic resonance spectra. FIG. 7 shows in detail: A sample 10 rotating in a stationary magnetic field B0 by means of an air turbine 11. The rotor of the air turbine 11 carries optical marks which serve to detect the frequency and phase of rotation of the sample by means of a light beam emitted by the light sensor 12. The sample cell is surrounded by a transmitter and receiving coil 6 connected to a sample-head network 7. The sample-head network 7 is supplied with the RF transmitter signal 4 from a frequency-conditioning system 17 which is controlled by a quartz-stabilized base oscillator 1. The RF transmitter signal 4 is supplied to the sample-head network 7 via an amplifier 5. The nuclear magnetic resonance signal received by the sample-head network 7 is supplied, via a pre-amplifier 8, to an amplitude modulator 13 which then performs the amplitude modulation according to the proposed method. After having been amplitude-modulated in this way, the nuclear magnetic signal is supplied to a superheterodyne receiver with quadrature detection. A compensation generator 18 is supplied by a light receiver 12 with signals 19 representative of the frequency and phase of the rotary movement of the sample 10. A compensation generator 18 generates the amplitude-modulation signals 44 and the phase-modulation signals 34 in response to the signals 13, and the signals 44 and 43 are then supplied to an amplitude-modulator 13 and a phase-modulator 14, respectively. The phase-modulator 14 modulates, with the aid of the phase-modulation signal 43 received, the phase of the nuclear magnetic signal in the receiver 9, prior to subjecting it to quadrature detection. Further, the phase-modulator 14 is supplied with a signal 3 from a local oscillator in the frequency-conditioning system 17. In addition, the compensation generator 18 guides the signal 45, which reflects the phase position of the rotation signal $\omega_m$, to a computer 16 which latter receives from the receiver 9 the nuclear magnetic signal which has been split up into its real and imaginary content, by the quadrature detection process. The computer 16 finally emits to the frequency-conditioning system 17 a trigger signal for the RF transmitter pulse.

The compensation generator 18 preferably has the structure illustrated in FIG. 8. It is supplied with additional external compensation-setting signals.

The position of the amplitude modulator 13 and the phase modulator 14 is of course not necessarily that illustrated in FIG. 7. Rather, these modulators may be installed practically at any desired suitable point along the receiving path. In particular, these modulators may be provided directly at the receiving resonant circuit. In practice, the phase modulator may be implemented for example with the aid of a voltage-variable capacitor which acts to detune the resonant circuit periodically, thus effecting a phase modulation. The amplitude modulator may be implemented using a diode whose operating point is varied periodically whereby periodic attenuation of the resonant circuit is effected. In addition, the phase modulator may be integrated either in any local oscillator path, or in the receiving path, for example directly downstream of the amplitude modulator 13. Or else the phase and amplitude modulation can be effected directly at the receiving resonant circuit, by modulating its resonant frequency and/or its attenuation. This latter method provides the advantage that rotational side bands are compensated directly after their generation, which may increase the stability of compensation over time. In addition, it is possible with this method, though only in the Q modulation case, to effect compensation balancing without a nuclear magnetic signal, by connecting a reflexion bridge to the receiving resonant circuit, via the sample-head network. In the balanced state of the bridge, the measurement is extremely sensitive to even smallest variations of the complex impedance of the resonant circuit, and accordingly to the Q modulation, so that the latter can be compensated to zero easily. It should also be noted in this connection that the result of each compensation step is immediately available and does not have to be transformed arithmetically.

The modulation of the resonance frequency of the receiving resonant circuit may be effected, for example, by means of a voltage-variable capacitor, a piezoceramic plate coated on both sides with evaporated metal layers having a capacitive effect, or by a mechanically driven capacitor plate in which case the driving frequency is derived from the rotation of the sample. Or else, it would be imaginable to modulate the resonance frequency of the receiving resonant circuit inductively, by mounting a short-circuited conductor loop, mounted on a piezoceramic plate, in the neighborhood of the resonant-circuit inductor. Modulation of the attenuation of the receiving resonant circuit may be effected, for example, by means of a diode or a field-effect transistor which may act as variable resistors by variation of their operating points.

Instead of the ways of generating the modulation signals which have been described heretofore and which are preferred, the functions of the amplitude and phase-modulator may also be utilized for conditioning the spectrum, by multiplying the complex time signal stored in the computer 16 by a complex factor A(t)·$e^{j\phi(t)}$, wherein A(t) is the amplitude-modulation function and $\phi(t)$ is the phase-modulation function. However, this compensation still requires the continuous information regarding the rotation frequency and the phase of the rotary movement of the sample so that these values necessarily have to be measured and stored together with the measurement of the respective nuclear-resonance spectrum.

This arithmetical method provides the advantage that the compensation process can be carried out by way of a single nuclear signal stored in the computer, which means that it is not necessary to excite the spin system again after each compensation step, and to wait thereafter until the nuclear magnetic signal has decayed, before the entire signal is available. In addition, it is possible with the aid of this method to sum up nuclear magnetic signals originating from several excitations in order to achieve an improved signal-to-noise ratio and to apply the arithmetic compensation method thereafter with much greater precision to the low-noise signal so stored. If, in addition, the computer is capable of effecting the Fourier transformation very quickly, then the variations provoked in the frequency spectrum by the balancing process are visible practically in real time which simplifies the process very significantly.

In the case of Q modulation compensation, too, all methods according to the invention provide that the modulation signals are combined from several components whose frequencies are equal to the frequency of rotation of the sample, and integral multiples thereof.

Starting out from a method for compensating at least one type of side bands ($H_0$—, $H_1$—, Q modulation side bands) provoked by rotation of the sample in a nuclear magnetic resonance spectrometer, an invention is seen also in the steps of detecting the frequency ($\omega_m$) and phase of rotation of the sample;

modulating the amplitude and phase of the detected nuclear signal, the modulation signals being composed of a plurality of components, whose frequencies are equal to the frequency of rotation ($\omega_m$) of the sample and integral multiples thereof, wherein the modulation signals are synchronized in locked phase relation to the rotation of the sample in the case of Q modulation compensation, in the case of $H_0$— and $H_1$—side-band compensation, the modulation components on the one hand are locked in phase with the rotation of the sample, and the start of the transmitter pulse or the pulse sequence for exciting the nuclear signal on the other hand is locked in phase with the modulation components, in the case of $H_0$— and $H_1$—side-band compensation, when the nuclear magnetic signals are summed up from a plurality of pulse excitations, the phase relation between the modulation components and the rotation of the sample on the one hand may be different for different recording periods, but is constant within each recording period, and the starting times of the transmitter pulse or the pulse sequence for the excitation of the nuclear magnetic signal and the modulation components on the other hand may exhibit any phase relationship which must however be constant over all excitation periods.

These steps specify possible procedures for detecting the nuclear magnetic signal on the basis of a single transmitter pulse or a single exciting pulse sequence on the one hand, or on the basis of a plurality of nuclear magnetic signals on the other hand. In the case of the $H_0$ and $H_1$ side band compensation it is therefore only necessary that the frequencies and the modulation components be always equal to the frequency of rotation of the sample or to a multiple thereof, whereas the phase positions may differ between the individual recording periods. It is an advantage of this method, which is to be regarded as independent relative to claims 2 and 6, that it provides an additional degree of freedom because the phase relationship between the modulation components and the rotation of the sample may be different in different recording periods and because this may help suppress systematic errors that may possibly occur in connection with the signal summing-up step.

The reference numerals included in the claims are not to be understood as restricting the claims, but are meant only to facilitate understanding.

We claim:

1. Method for compensating at least one type of side band selected from a group of side bands consisting of $H_0$, $H_1$, and Q modulation side bands, which are provoked by rotation of a sample in a nuclear magnetic resonance spectrometer, said method comprising:

detecting a frequency of rotation ($\omega_m$) and phase of rotation of the sample; and modulating an amplitude and phase of a detected nuclear signal with modulation signals, the modulation signals being composed of modulation components having frequencies equal to the frequency of rotation ($\omega_m$) of the sample and integral multiples thereof, the modulation components being synchronized in locked phase relation to the rotation of the sample for Q modulation compensation, and for $H_0$ and $H_1$ side-band compensation, the modulation components are locked in phase with the rotation of the sample and the start of the transmitter pulse, or a pulse sequence for exciting the nuclear signal is locked in phase with the modulation components, and for $H_0$ and $H_1$ side-band compensation, when nuclear magnetic signals are summed up from a plurality of pulse excitations, the phase relation between the modulation components and the rotation of the sample is constant within each recording period, despite differences for different recording periods and starting times of the transmitter pulse, or a pulse sequence for the excitation of the nuclear magnetic signal, and the modulation components exhibit a constant phase relationship over all excitation periods.

2. Method for compensating at least one type of side band selected from a group of side bands consisting of $H_0$, $H_1$, and Q modulation side bands, which are provoked by rotation of a sample in a nuclear magnetic resonance spectrometer, said method comprising:

detecting a frequency of rotation ($\omega_m$) and phase of rotation of the sample;

modulating an amplitude and phase of a detected nuclear signal with modulation signals, the modulation signals being composed of a plurality of modulation components, each depending on phase positions and intensities of generated rotational side bands, as detected from a nuclear magnetic resonance spectrum, for Q modulation compensation, the modulated signals are in fixed phase synchronism with the rotation of the sample, and the frequencies of the modulation components are equal to the frequency of rotation ($\omega_m$) of the sample and integral multiples thereof, for $H_0$ and $H_1$ side-band compensation, each of the phases of the modulation components is fixed in phase in relation to a phase of the rotation of the sample, and the start of a transmitter pulse, or a pulse sequence for exciting the nuclear signal is synchronous in phase with the modulation signals.

3. Method according to claim 1, wherein the amplitude and the phase of each individual frequency component of the plurality of modulation components is adjusted separately in the modulation step, the frequency components so adjusted are then added and subjected to amplitude and phase modulation.

4. Method according to claim 1, wherein a plurality of cosinoidal and sinoidal signals with frequencies ($\omega_m$, $2\omega_m$, $3\omega_m$) equal to an integral multiple of the frequency of rotation ($\omega_m$) of the sample are generated in advance, amplitudes of the signals are set at the respective amplitudes necessary for compensation, and the cosinoidal and sinoidal signals so generated and adjusted in amplitude are then added and subjected to amplitude and phase modulation.

5. Method according to claim 3, wherein the modulation signals are generated in a digital frequency generator, by resetting respective coefficients.

6. Method for compensating side bands provoked by Q modulation, which are generated in a pulsed nuclear magnetic resonance spectrometer by a non-ideal rotational movement of the sample, said method comprising:
   detecting a frequency of rotation ($\omega_m$) and phase of the rotation of the sample;
   detecting a number (N) and frequencies ($\omega_m$, $2\omega_m$, $3\omega_m$ . . . ), to be compensated in undesirable sideband components; and
   summing up a plurality of nuclear signals, which are phase-shifted relative to each other by predetermined phase angles ($\Delta\phi$) and which have their origin in several excitations, the sum of 2N nuclear signals with phase shifts of $$\Delta\phi = n \cdot 360°; \quad n = 0, 1, 2, 3, \ldots, 2N - 1)$$

being necessary for eliminating N side-band components.

7. Use of a method according to claim 1 for conditioning nuclear magnetic resonance spectra after generation thereof, wherein the amplitude and phase modulation of the spectrum is effected by a computer by multiplication of the complex time signal corresponding to the spectrum by a complex factor (A(t) $e^{j\phi(t)}$, wherein A(t) is the function of time of the amplitude modulation and $\phi(t)$ is the function of time of the phase modulation.

8. Device for compensating at least one type of side band selected from a group of side bands consisting of $H_0$—, $H_1$—, and Q modulation side bands, produced by rotation of a sample in a nuclear magnetic resonance spectrometer, said device comprising:
   transmitter and receiver coil means, disposed in a DC magnetic field (BO), for embracing the rotating sample, the sample receiving an RF signals from a sample head and emitting a nuclear signal to the sample head;
   signal generation and evaluation device means for generating the RF signal supplied to the sample head and generating a spectrum from the nuclear signal received by the sample head;
   detector means for detecting the frequency ($\omega_m$) and phase of the rotary movement of the sample;
   compensation generator means for receiving signals representative of the frequency ($\omega_m$) and phase of the rotary movement of the sample as detected by the detector means and generating in response to these signals, amplitude and phase-modulation signals for modulating the amplitude and phase of the nuclear signal emitted by the sample and detected by the sample head, the compensation generator comprising:
   - phase and amplitude setting means for composing the modulation signals from a plurality of components, in response to setting signals, which are representative of phase positions and intensities of the rotational side bands appearing from time to time, as detected from the nuclear magnetic resonance frequency spectrum,
   - amplitude modulator means for amplitude-modulating the detected nuclear signal by the modulation signal generated by the compensation generator means,
   - phase modulator means for phase-modulating the detected nuclear signal by the modulation signal generated by the compensation generator in order that
   - the modulation signals are synchronized in locked phase relation to the rotation of the sample in the case of Q modulation compensation, and
   - the frequencies of the modulation components are equal to the frequency of the rotation ($\omega_m$) of the sample and integral multiples thereof, and in the case of $H_0$ and $H_1$ sideband compensation, each of the phases of these components has a fixed relation to the phase of the rotation of the sample, and the start of the transmitter pulse or the pulse sequence for exciting the nuclear signal is synchronous in phase with the modulation signal.

9. Device according to claim 8, wherein the phase and amplitude setting means comprises,
   for each pair of side bands to be compensated, two continuously and separately settable phase shifters and two separately settable attenuator elements for separate adjustment of the phase and amplitude of the signals to be supplied to the phase and amplitude modulator means.

10. Device according to claim 8, wherein the phase and amplitude setting means comprises, for each pair of side bands to be compensated, one oscillator module for generating cosinoidal and sinoidal signals with frequencies equal to an integral multiple, including the simple, frequency of rotation ($\omega_m$) of the sample, each oscillator module comprising continuously adjustable attenuator elements means for setting the required amplitude of each sinoidal and cosinoidal signal, a fixed 90° phase shifter deriving the cosinoidal signals from the sinoidal signals and comprising a polarity-reversing switch for each attenuator element, and
   adding element means for adding the sinoidal and cosinoidal signals emitted by the polarity-reversing switches, the output signals of the adding elements being supplied in each case to the amplitude and phase modulator.

11. Device according to claim 8, wherein the compensation generator means comprises digital frequency generator means for producing the modulation signals by presetting corresponding coefficients.

12. Device according to claim 8, wherein the phase and amplitude modulation is effected directly on a receiving oscillant circuit, by modulating the latter's resonant frequency by means of a voltage-variable capacitor and/or its attenuation by means of a diode.

13. Method according to claim 2, wherein the amplitude and the phase of each individual frequency component of the plurality of modulation components is adjusted separately in the modulation step, the frequency components so adjusted are then added and subjected to amplitude and phase modulation.

14. Method according to claim 2, wherein a plurality of cosinoidal and sinoidal signals with frequencies ($\omega_m$, $2\omega_m$, $3\omega_m$) equal to an integral multiple of the frequency of rotation ($\omega_m$) of the samples are generated in advance, amplitudes of the signals are set at the respective amplitudes necessary for compensation, and the cosinoidal and sinoidal signals so generated and adjusted in amplitude are then added and subjected to amplitude and phase modulation.

15. Use of a method according to claim 2 for conditioning nuclear magnetic resonance spectra after generation thereof, wherein the amplitude and phase modulation of the spectrum is effected by a computer by multiplication of the complex time signal corresponding to the spectrum by a complex factor ($A(t)\ e^{j\phi(t)}$, wherein $A(t)$ is the function of time of the amplitude modulation and $\phi(t)$ is the function of time of the phase modulation.

* * * * *

UNITED STATES PATENT AND TRADEMARK OFFICE
CERTIFICATE OF CORRECTION

PATENT NO. : 5,191,287
DATED : March 2, 1993
INVENTOR(S) : Marek et al

It is certified that error appears in the above-indentified patent and that said Letters Patent is hereby corrected as shown below:

On the title page: Item [56] Foreign Priority Data

May 10, 1990 DE FED REP GERMANY     P40115056.9
June 13, 1990 DE FED REP GERMANY    P4018836.1

Signed and Sealed this

Eighteenth Day of January, 1994

Attest:

BRUCE LEHMAN

*Attesting Officer*     *Commissioner of Patents and Trademarks*